US011729944B2

(12) United States Patent
Chen et al.

(10) Patent No.: US 11,729,944 B2
(45) Date of Patent: Aug. 15, 2023

(54) COLD PLATE WITH ANTI-CLOGGING MECHANISM

(71) Applicant: Quanta Computer Inc., Taoyuan (TW)

(72) Inventors: Chao-Jung Chen, Taoyuan (TW); Yu-Nien Huang, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 78 days.

(21) Appl. No.: 17/445,374

(22) Filed: Aug. 18, 2021

(65) Prior Publication Data

US 2022/0377937 A1     Nov. 24, 2022

Related U.S. Application Data

(60) Provisional application No. 63/191,648, filed on May 21, 2021.

(51) Int. Cl.
*H05K 7/20*     (2006.01)

(52) U.S. Cl.
CPC ..... *H05K 7/20254* (2013.01); *H05K 7/20272* (2013.01); *H05K 7/20409* (2013.01); *H05K 7/20509* (2013.01)

(58) Field of Classification Search
None
See application file for complete search history.

(56) References Cited

U.S. PATENT DOCUMENTS

| | | | |
|---|---|---|---|
| 7,272,006 B2 * | 9/2007 | Mongia | H01L 23/473 257/E23.098 |
| 7,336,487 B1 * | 2/2008 | Chrysler | H01L 23/473 361/679.48 |
| 7,808,781 B2 * | 10/2010 | Colgan | H01L 23/473 257/714 |
| 10,874,030 B2 * | 12/2020 | Chen | H05K 7/20772 |
| 10,952,354 B1 * | 3/2021 | Chen | H01L 23/46 |
| 11,175,102 B1 * | 11/2021 | Harrington | H01L 23/473 |
| 2006/0071326 A1 * | 4/2006 | Chrysler | H01L 23/473 257/E23.098 |
| 2018/0343771 A1 * | 11/2018 | Wei | H05K 7/20272 |
| 2020/0110448 A1 * | 4/2020 | Lee | H05K 7/20272 |
| 2020/0352053 A1 * | 11/2020 | Mizerak | H01L 23/473 |
| 2021/0105911 A1 * | 4/2021 | Yang | H05K 7/20509 |

* cited by examiner

*Primary Examiner* — Courtney L Smith
(74) *Attorney, Agent, or Firm* — Nixon Peabody LLP

(57) ABSTRACT

A cold plate for cooling a heat-generating component in a computer system is disclosed. The cold plate includes a lid member with a lower supply manifold housing and a lower collection manifold housing. The cold plate includes a base member having coolant channels defined by fins. Each of the fins have a top section and a bottom section attached to the base member. An interior cavity is defined by an arc-shaped section of the fins, the interior surface of the base, and the lower supply manifold housing. An interior corner is formed by the lower supply manifold housing of the lower manifold housing at the top of the fins to trap debris. An upper inlet manifold has a connector to receive coolant. An upper outlet manifold has a connector to circulate coolant. The upper manifolds are in fluid communication with the collection manifold housings.

18 Claims, 7 Drawing Sheets

COLD PLATE WITH ANTI-CLOGGING MECHANISM

CROSS-REFERENCE TO RELATED APPLICATIONS

This application claims priority from and benefit of U.S. Provisional Patent Application Ser. No. 63/191,648, filed on May 21, 2021, titled "Anti-clog of Efficient Cold Plate in Liquid Cooling" which is hereby incorporated by reference herein in its entirety.

TECHNICAL FIELD

The present invention relates generally to liquid cooling systems, and more specifically, to a cold plate having manifolds at different levels that are arranged to prevent debris from clogging internal channels.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK, while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In rack level liquid cooling system designs, the cooling liquid source includes a closed loop cooling system and an open loop cooling system to facilitate heat exchange. Known closed loop liquid cooling systems use heat exchange to cool hot water which is heated from a heat source such as a server. Heat is then removed from the hot water in the closed loop liquid cooling system via an open loop system such as a radiator in proximity to a fan wall. The closed loop cooling system includes the heat source and a heat exchanger. A liquid flow pipe carries coolant liquid to the heat source. Heat generated by the heat source is transferred to the coolant liquid. A liquid flow pipe carries heated liquid away from the heat source.

The rack holds a series of servers. Within each of the servers, an inlet tube carries coolant liquid to a cold plate that is attached over a heat-generating electrical component, such as a processor chip. The cold plate has a network of internal conduits or channels that circulate the coolant internally in the cold plate. Each processor in a server may have a dedicated cold plate or share a cold plate with another processor. Heat generated by the processor is transferred to the cold plate and is in turn transferred to the coolant liquid circulating through the cold plate. An outlet tube carries heated liquid away from the cold plate.

FIG. 1A is a perspective view of a prior art server 10 having cold plates installed on components. The server 10 includes a chassis 12 that has a circuit board 14 mounting components such as memory cards 16 and processors 18. In this example, four cold plates 22, 24, 26, and 28 are mounted over heat-generating electrical components, such as the processors 18 to transfer heat away from the processors 18. A series of tubes 30 are provided to circulate coolant to the cold plates 22, 24, 26, and 28 and collect heated coolant. Generally, the chassis 12 includes fluid connectors that may be fluidly connected to a rack mounted heat exchanger.

FIG. 1B is a perspective view of the cold plate 22 in FIG. 1A. The cold plate 22 includes a base member 40 and a lid member 42. The lid member 42 includes an inlet connector 44 and two outlet connectors 46. The inlet connector 44 may be connected to one of the tubes 30 in FIG. 1A to supply coolant to the cold plate 22. The heated coolant is collected at two outlet connectors 46 and recirculated through another tube 30 in FIG. 1A. As shown in FIG. 1B, the coolant enters the inlet connector 44 and is channeled to the center of the cold plate 22. The heated coolant circulates to the sides of the lid member 42 to one of the two outlet connectors 46.

FIG. 1C is a cutaway perspective view of the base member 40 in FIG. 1B. The base member 40 includes a top surface 50 that includes two side tabs 52 and 54 that include holes 56 for fasteners 58 to mate the cold plate 22 to a processor socket that holds a processor chip. The lid member 42 is generally soldered to the center of the surface 50. The surface 50 defines a depression 60 that allows the mating of corresponding walls of the lid member 42. The depression 60 includes an inlet slit 62 that receives coolant from the inlet connector 44 of the lid member 42 in FIG. 1B. The slit 62 allows the coolant to be circulated to a series of internal fins in the interior of the base 40 that allow the coolant absorb heat from the bottom of the base member 40. The circulated coolant carries the heat away when the coolant is collected at the sides of the base member 40 by one of the outlet connectors 46 in FIG. 1B. Thus, the prior art design cold plate 22 has split-flow coolant path where the coolant inlet slit 62 is at the center of the base member 40. However, this design is susceptible to clogging from debris such as particles or mud carried by the coolant through the slit 62. This debris may be trapped in the internal channels of the base member 40 thereby impeding coolant flow. Further, such a split design only has single inlet that does not effectively distribute coolant for devices that have different surface areas and therefore cannot fit any multiple heat source in one chip.

Thus, there is a need for a cold plate design that allows even distribution of coolant to maximize cooling coverage. There is also need for a cold plate mechanism that controls the intake flow of coolant. There is another need for a cold plate design that prevents debris from being caught in the internal fins and thereby block coolant circulation.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example cold plate for cooling a heat-generating component is disclosed. The cold plate has a lid member having a lower supply manifold housing and a lower collection manifold housing. The cold plate includes a base member having an exterior surface for contacting the heat-generating component and an opposite interior surface. The base member includes coolant channels defined by a plurality of fins. Each of the fins has a top section and a bottom section attached to the interior surface. An interior cavity is defined by an arc-shaped section of each of the fins, the interior surface of the base, and the lower supply manifold housing. An interior corner is formed by the lower supply manifold housing of the lower manifold housing at the top of the fins. An upper inlet manifold has a connector to receive coolant. The inlet manifold is in fluid communication with the lower supply manifold housing. An upper outlet manifold has a connector to circulate coolant. The upper outlet manifold is in fluid communication with the lower collection manifold housing.

A further implementation of the example cold plate is where the lower supply manifold housing includes an inlet aperture. Another implementation is where the lower supply manifold housing includes a plurality of inlet apertures spaced over a length of the lower supply manifold housing. Another implementation is where the inlet manifold connector includes a tube connector. Another implementation is where the lid member and the base member are fabricated from one of a group of copper, copper alloy, stainless steel, and aluminum alloy. Another implementation is where the lid member and the base member are soldered together. Another implementation is where the inlet manifold may be rotated relative to the lower supply manifold housing. Another implementation is where the lid member includes a cover plate member disposed between the lower manifold housings. The lid member is in contact with the top sections of the plurality of fins.

According to certain aspects of the present disclosure, an example computer system is disclosed. The computer system includes a heat-generating computer component, a hot coolant connector and a cold coolant connector. The computer system also includes a cold plate having a lid member with a lower supply manifold housing and a lower collection manifold housing. The cold plate has a base member with an exterior surface contacting the heat-generating computer component and an opposite interior surface. The base member includes coolant channels defined by a plurality of fins. Each of the fins has a top section, a bottom section attached to the interior surface, and an arc-shaped section between the top and bottom sections. An interior cavity is defined by the arc-shaped section of each of the fins, the interior surface of the base, and the lower supply manifold housing. An interior corner is formed by the lower supply manifold housing of the lower manifold housing at the top of the fins. An upper inlet manifold has a connector to receive coolant from the cold coolant connector. The inlet manifold is in fluid communication with the lower supply manifold housing. An upper outlet manifold has a connector to circulate coolant to the hot coolant connector. The upper outlet manifold is in fluid communication with the lower collection manifold housing.

A further implementation of the example computer system is where the lower supply manifold housing includes an inlet aperture. Another implementation is where the lower supply manifold housing includes a plurality of inlet apertures spaced over a length of the lower supply manifold housing. Another implementation is where the inlet manifold connector includes a tube connector coupled to a tube fluidly coupled to the cold coolant connector. Another implementation is where the lid member and the base member are fabricated from copper. Another implementation is where the lid member and the base member are soldered together. Another implementation is where the inlet manifold may be rotated relative to the lower supply manifold housing. Another implementation is where the lid member further includes a cover plate member disposed between the lower manifold housings. The lid member is in contact with the top sections of the plurality of fins. Another implementation is where the heat-generating computer component is a processor chip.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
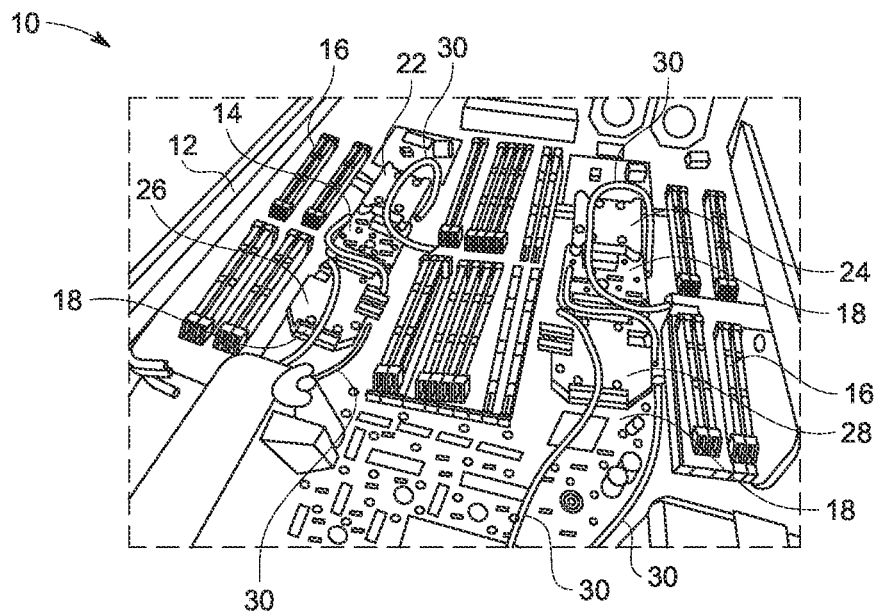
FIG. 1A is a perspective view of a prior art computer system with a liquid cooling system, according to certain aspects of the present disclosure.
Figure 1B:
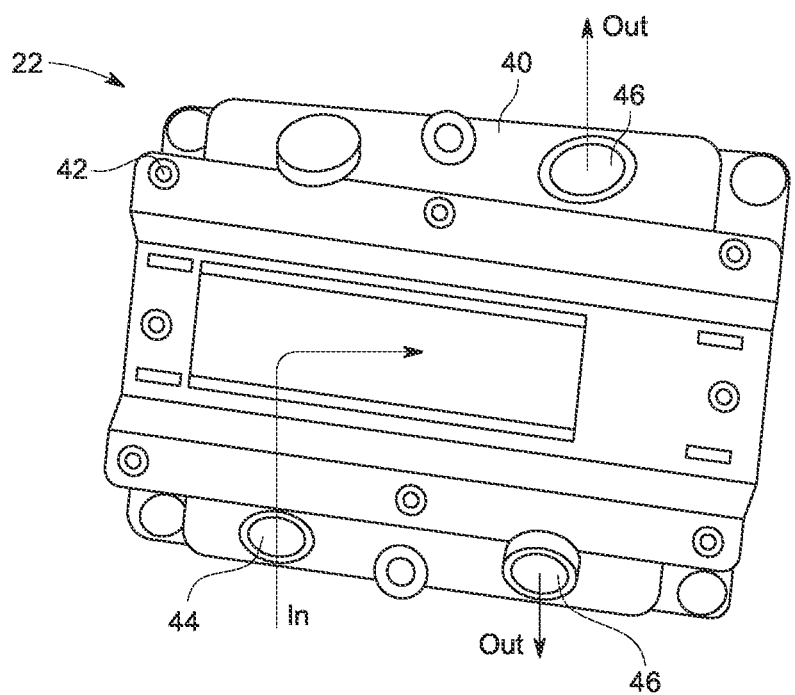
FIG. 1B is a perspective view of a prior art cold plate in FIG. 1A.
Figure 1C:
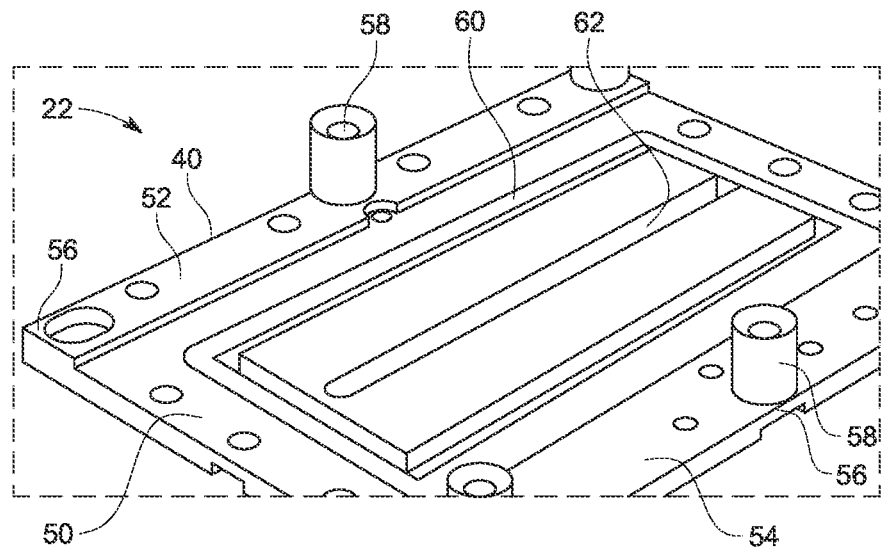
FIG. 1C is a perspective cutaway view of the base member of the prior art cold plate in FIG. 1A.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a cold plate having a dual manifold design. An upper level inlet manifold has the purpose of adjusting major liquid volume flow rate of coolant supplied to the cold plate. The upper level inlet manifold sits on a top surface of a cold plate lid member. Another upper level outlet manifold provides the return coolant connector. The upper level inlet and outlet manifolds may be fluidly connected to lower manifolds formed by the lid member and the base member. A corner feature is formed in the lower manifold to trap debris from being circulated through the fins in the base member. At least two inlets may be formed between the upper and lower manifolds to allow for better distribution of the coolant to match the heat source positions in a chip thermally attached to the cold plate.

Figure 2A:
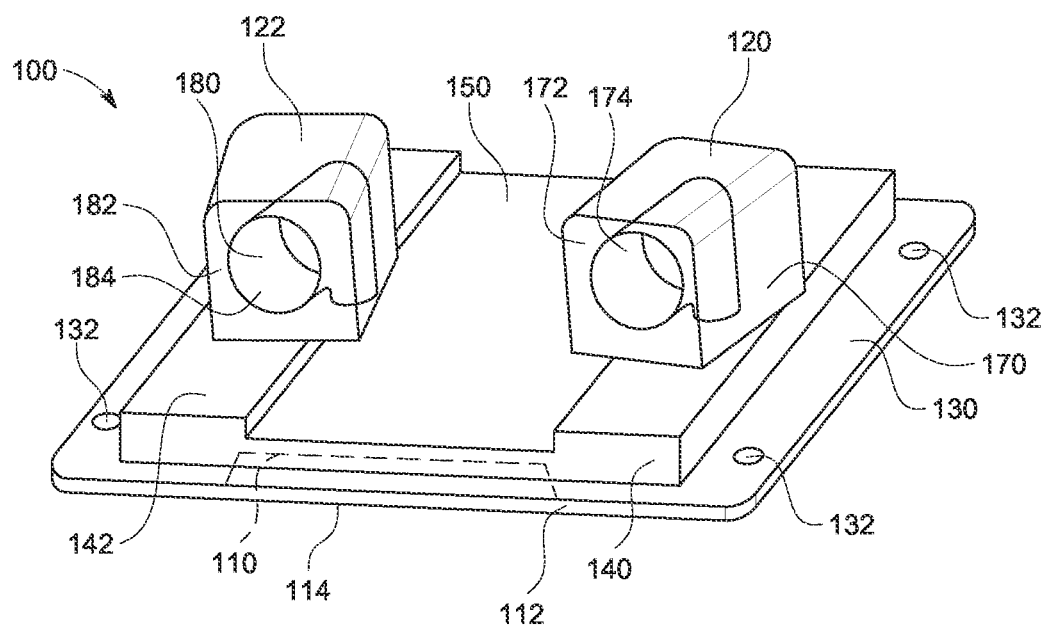
FIG. 2A is a perspective view of an example dual level manifold cold plate, according to certain aspects of the present disclosure.

FIG. 2A is a perspective view of an example cold plate 100 that has a dual level manifold design that distributes coolant flow and prevents debris from impeding coolant flow. The cold plate 100 may be attached to a chip socket so the cold plate 100 is in thermal contact with a heat-generating component such as a processor chip. In this example, the chip may be part of a computer component such as a storage server, an application server, a network switch, or other electronic devices. The computer component has a fully sealed chassis to allow circulation of coolant to cool internal elements in the chassis by a liquid cooling system.

The computer component is generally placed in a rack with a liquid cooling system having a cold coolant manifold and a hot coolant manifold. The sealed chassis that encloses the electronics such as power supplies, circuit boards, device cards, processors, memory devices, and other elements of the computer component. In this example, the rear of the chassis includes an inlet connector that may be connected to a fluid couplers of a cold coolant manifold. The rear of the chassis also includes an outlet connector that may be connected to a fluid coupler of a hot coolant manifold. The chassis may include an internal network of fluid tubes that circulate coolant to the cold plates such as the cold plate 100.

The liquid cooling system generally includes a heat exchanger that receives the hot coolant from hot coolant manifold. The heat exchanger generally includes a radiator that circulates the hot coolant. A fan wall provides cooling of the coolant in the radiator. The now cooled coolant is circulated by a pump of a coolant distribution unit to the cold coolant manifold.

The cold plate 100 has a base member 110 and a lid member 112. The base member 110 and the lid member 112 are fabricated from heat conductive metal such as aluminum alloy, copper, copper alloy or stainless steel. In this example, the base member 110 and the lid member 112 are tooled separately from copper and soldered together. The base member 110 includes a flat bottom surface 114 that is placed in thermal contact with the heat-generating component such as a processor chip. Thermal paste may be applied to the bottom surface 114 to create better thermal flow between the bottom surface 114 and the processor chip. The surface area of the processor chip may range from the almost the entire surface area of the bottom surface 114 of the base member 110 to some fraction of the entire area of the bottom surface of the base member 110.

As will be explained, the base member 110 includes internal channels defined by fins that serve to circulate the coolant. Heat is transferred from the bottom surface of the base member 110. The lid member 112 is attached to an upper inlet manifold 120 and an upper outlet manifold 122 to the circulated coolant. The purpose of the upper inlet manifold 120 is to supply coolant and adjust major liquid volume flow rate. The upper outlet manifold 122 collects the heated coolant for circulation through the liquid cooling system.

Figure 2B:
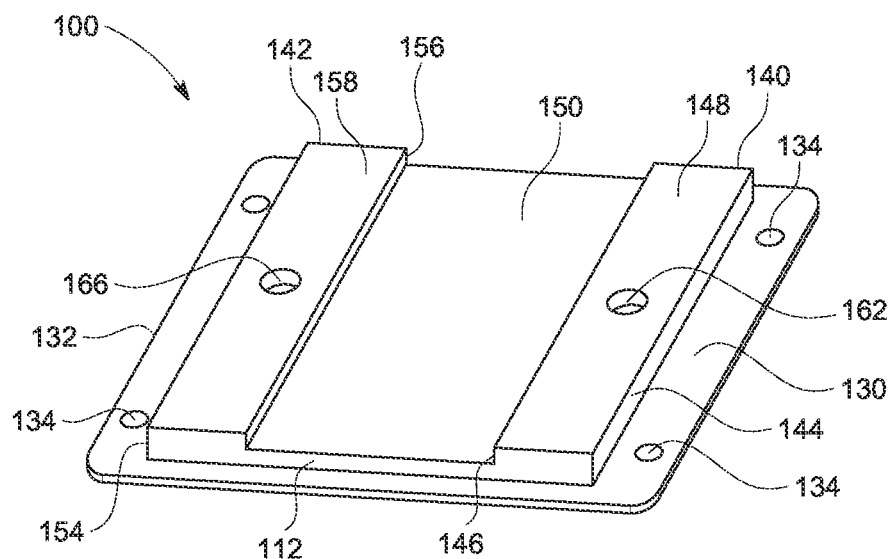
FIG. 2B is a perspective view of the lid member of the example cold plate in FIG. 2A, according to certain aspects of the present disclosure.
Figure 2C:
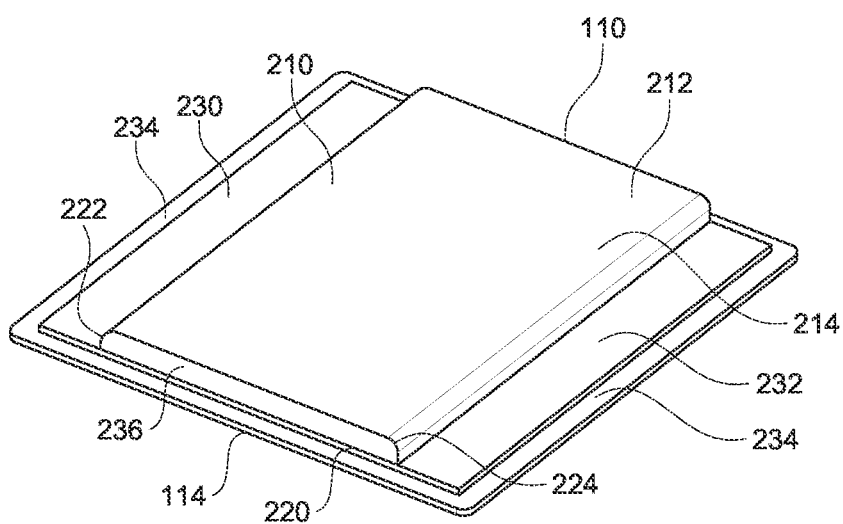
FIG. 2C is a perspective view of the base member of the example cold plate in FIG. 2A, according to certain aspects of the present disclosure.

FIG. 2B is a perspective view of the lid member 112 of the example cold plate in FIG. 2A. FIG. 2C is a perspective view of the base member 110 of the example cold plate in FIG.

Figure 2D:
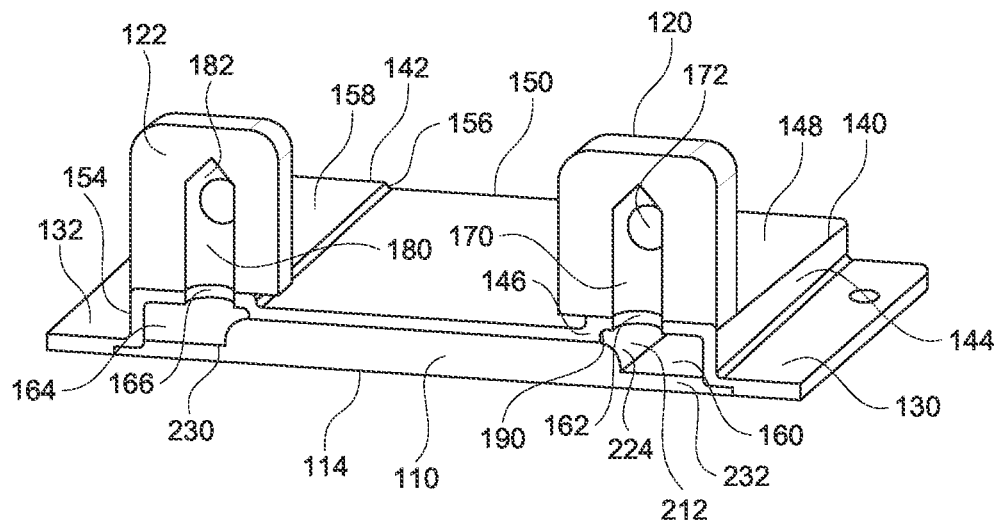
FIG. 2D is a cutaway perspective view of the inlet and outlet upper level manifolds in relation to the lower level manifolds of the example cold plate in FIG. 2A, according to certain aspects of the present disclosure.

2A. FIG. 2D is a cutaway perspective view of the upper level inlet and outlet manifolds 120 and 122 in relation to the lower level manifolds formed by the base member 110 and the lid member 112.

As shown in FIGS. 2A-2B, the lid member 112 includes two side tabs 130 and 132. Both of the side tabs 130 and 132 include several holes 134 that allow fasteners such as screws or bolts to be employed to attach the cold plate 100 to a chip socket on the motherboard of the computer component. The lid member 112 includes a rectangular lower supply manifold housing 140 and a rectangular lower collection manifold housing 142. The rectangular supply manifold housing 140 supplies coolant to the channels formed in the base member 110. The rectangular lower collection manifold housing 142 collects the heated coolant from the channels in the base member 110.

The rectangular supply manifold housing 140 includes an exterior side 144, an opposite interior side 146 and a top panel 148. A center plate 150 joins the manifold housings 140 and 142. The rectangular lower collection manifold housing 142 includes an exterior side 154, an opposite interior side 156, and a top panel 158. The width of the center plate 150 is thus defined by the connected interior side 146 of the rectangular supply manifold housing 140 and the interior side 156 of the rectangular lower collection manifold housing 142.

Figure 2E:
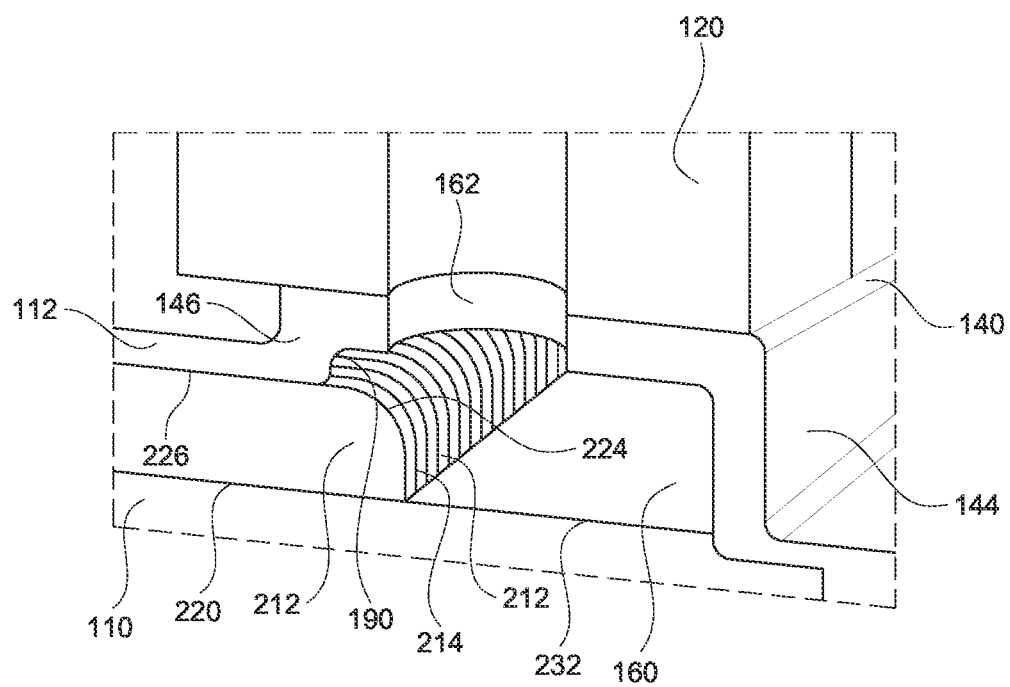
FIG. 2E is a cutaway perspective view of the fins forming the coolant channels in the base member of the example cold plate in FIG. 2A, according to certain aspects of the present disclosure.

As shown in FIG. 2C, the base member 110 includes a coolant flow section 210 that includes a series of parallel fins 212 that define channels 214 that run along the length of the base member 110. FIG. 2E shows a close-up of the channels 214. The fins 212 each have a bottom section that is attached to an interior surface 220 opposite the bottom surface 114 of the base member. Each of the fins 212 include opposite arc-shaped sections 222 and 224. Each of the fins 212 also include a top section 226 joining the arc-shaped sections 222 and 224. The top sections 226 of each of the fins 212 are in contact with the bottom of the plate 150 of the lid member 112 to define the height of the channels 214. The base member 110 includes two side wings 230 and 232. Each of the wings 230 and 232 have an edge tab 234 that may be joined to a registration feature on the lid member 112.

FIG. 2D is a cutaway perspective view of the fins 212 forming the coolant channels 214 in the base member 110 of the example cold plate 100. The sides 144 and 146, top panel 148 of the rectangular lower supply manifold housing 140, and arc-shaped sections 224 of the fins 212, in combination with the base member 110, form an interior cavity 160 to allow distribution of fluid to the base member 110. The top panel 148 of the rectangular supply manifold housing 140 includes a coolant aperture 162 that allows fluid access to the interior cavity 160 of the rectangular supply manifold housing 140. The upper inlet manifold 120 is mounted over the coolant aperture 162 to allow coolant to flow into the coolant aperture 162 to the lower supply manifold created by the supply manifold housing 140 and the base member 110. The sides 154 and 156, and top panel 158 of the rectangular lower collection manifold housing 142 in combination with the base member 110, form an interior cavity 164 to allow collection of fluid from the base member 110. The top panel 158 of the rectangular lower collection manifold housing 142 includes a coolant aperture 166 that allows fluid access to the interior cavity 164 of the rectangular lower collection manifold housing 142. The outlet manifold 122 is mounted over the coolant aperture 166 to allow collected coolant to flow from the coolant aperture 166. The side wings 230 and 232 of the base member 110 form the bottom of the interior cavities 160 and 164 respectively.

The inlet manifold 120 in this example may be rotated relative to the surface of the top panel 148 to allow greater flexibility for connection of coolant hoses. Alternatively, the inlet manifold 120 may be at a fixed orientation. The inlet manifold 120 includes a lateral interior conduit 170 that has an open end that provides fluid communication with the coolant aperture 162. A connector socket 172 is formed with a threaded interior surface 174. The connector socket 172 allows a connector to be mated and secured through the threaded interior surface 174. The connector may be connected on one end of a coolant supply hose that provides coolant to the inlet manifold 120.

The outlet manifold 122 in this example may be rotated relative to the surface of the top panel 158 to allow greater flexibility for connection of coolant hoses. The outlet manifold 122 includes a lateral interior conduit 180 that has an open end that provides fluid communication with the coolant aperture 166. A connector socket 182 is formed with a threaded interior surface 184. The connector socket 182 allows a connector to be mated and secured through the threaded interior surface 184. The connector may be connected to one end of a coolant collection hose that allows coolant to flow out of the computer component.

FIG. 2E is a close-up perspective view of the fins 212 of the base member 110 and the corner formed by the interior surfaces of the supply manifold housing 140. Like elements in FIGS. 2A-2D are labeled with identical reference numbers in FIG. 2E. In this example, the interior side 146 of the supply manifold housing 140 has an interior surface that defines an interior corner 190 where the interior side 146 joins the top panel 148. As will be explained, the interior corner 190 in conjunction with the arc-shaped sections 224 of the fins 212 trap debris before it enters the channels 214.

Thus, the example cold plate 100 is formed by the assembly of the base member 110 and the lid member 112, as shown in FIG. 2D. The upper level inlet manifold 120 directs the coolant to the lower level supply manifold defined by the interior cavity 160. Each of the fins 212 have the arc-shaped leading edge section 224. The interior corner 190 is formed at the top of the fins 212. Another corner is formed at bottom of the fins 212 that is attached to the wing 232 of the base member 110. When the incoming coolant is debris-free, the coolant will flow through the short distance path between the top sections 226 and the bottoms of the fins 212. When the coolant carries debris such as particles or mud, the interior corner 190 catches the debris, but the coolant can still flow through the channels 214 defined by the fins 212.

Figure 3:
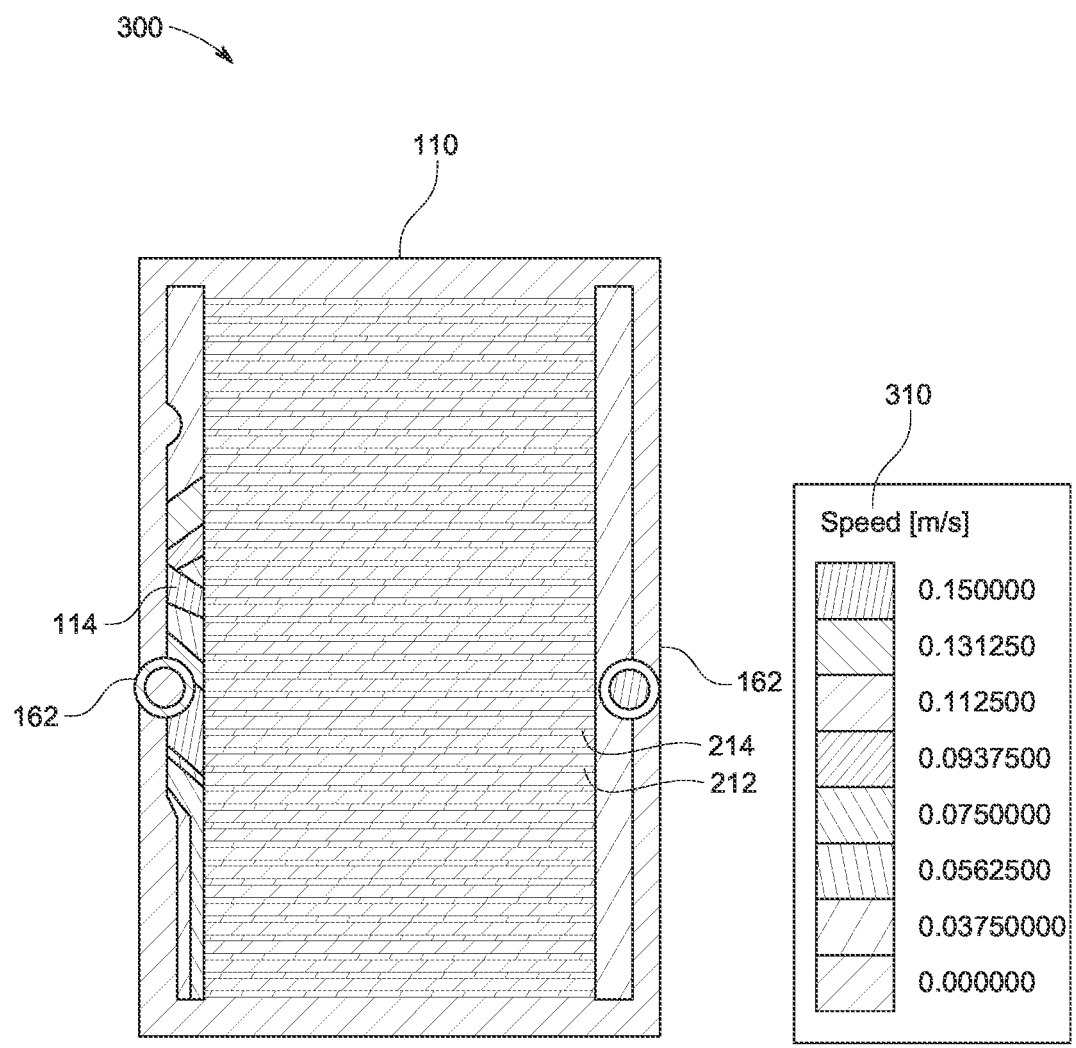
FIG. 3 is a computational fluid dynamics (CFD) diagram of the example cold plate in FIGS. 2A-2E, according to certain aspects of the present disclosure.

FIG. 3 is a computational fluid dynamics (CFD) analysis diagram 300 of liquid velocity distribution in the example base member 110 shown in FIG. 2C. The velocities are represented by the shadings in a table 310. Liquid velocity of the coolant in the channels 214 between the fins 212 is controlled by the position of the inlet aperture 162 and the outlet aperture 166. As shown in the diagram 300, the highest velocity is near the inlet aperture 162. However, the velocity of the coolant flow and therefore cooling is compromised at areas of the bottom surface 114 of the base member 110 that are distanced from the inlet aperture 162. Thus, the coolant distribution by the cold plate 100 is optimal for a chip that has a smaller surface area primarily in contact with the middle of the base member 110. Cooling for a chip with a larger surface area may not be optimal because parts of the chip that are in contact with the areas of the bottom surface 114 that are relatively far from the inlet aperture 162 do not receive the same level of cooling.

Another example cold plate may have a longer length inlet manifold that allows more even fluid velocities along the length of the base member. Thus, this cold plate allows for more even coolant distribution and thus may be tailored for different surface areas of chips that may encompass the entire area of the base member. This type of cold plate may have more than one inlet aperture to fit the heat source characteristics of a particular chip.

Figure 4A:
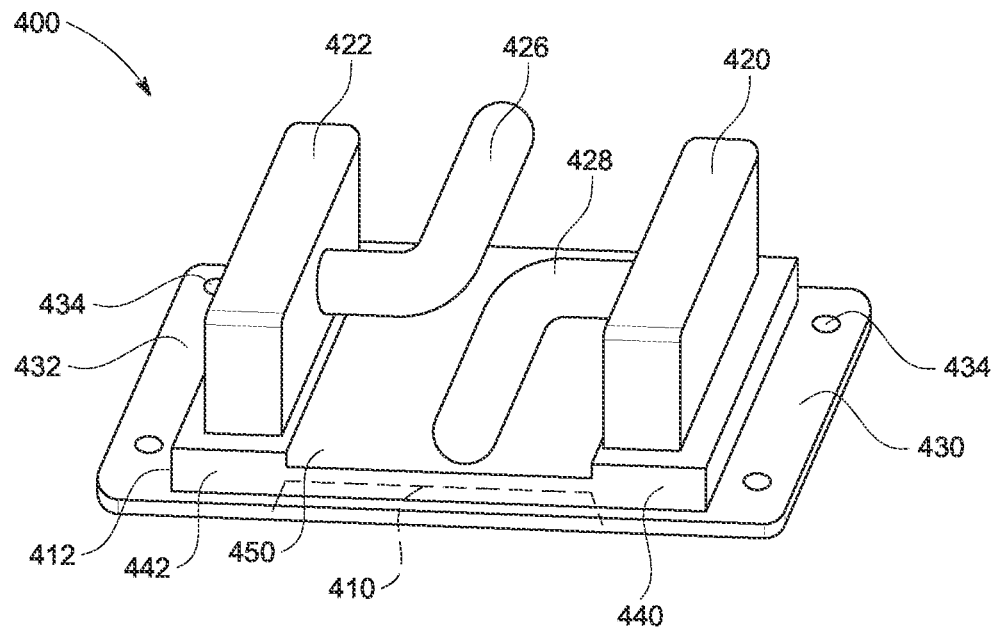
FIG. 4A is a perspective view of another example cold plate, according to certain aspects of the present disclosure.

FIG. 4A is a perspective view of another example cold plate 400 that allows for distribution of coolant to match the size of a heat-generating component. The cold plate 400 in FIG. 4A has an arrangement of two levels of manifolds similar to that of the cold plate 100 in FIGS. 2A-2E that prevent clogging from debris carried in coolant. The example cold plate 400 has three inlets and outlets coupling the upper level inlet and outlet manifolds to the lower level manifolds. The inlets and outlets are positioned to distribute coolant velocity evenly along the length of the cold plate 400 to allow the optimal cooling of a chip have a surface area that is approximately the same as that of the cold plate 400.

The cold plate 400 has a base member 410 and a lid member 412. The base member 410 and the lid member 412 are fabricated from heat conductive metal such as aluminum alloy or copper. In this example, the base member 410 and the lid member 412 are tooled separately and soldered together. The base member 410 includes a flat bottom surface that is placed in thermal contact with the heat-generating component such as a processor. Similar to the base member 110 in FIG. 2C, the base member 410 includes internal channels defined by fins with arc-shaped leading edges to circulate the coolant and transfer heat from bottom surface of the base member 410. The lid member 412 is attached to an upper level inlet manifold 420 and an upper level outlet manifold 422. The purpose of the inlet manifold 420 is to supply coolant and adjust major liquid volume flow rate. The inlet manifold 420 thus is connected to a coolant supply tube 424. The outlet manifold 422 collects the heated coolant for circulation through the liquid cooling system and thus is connected to a coolant return tube 426.

Figure 4B:
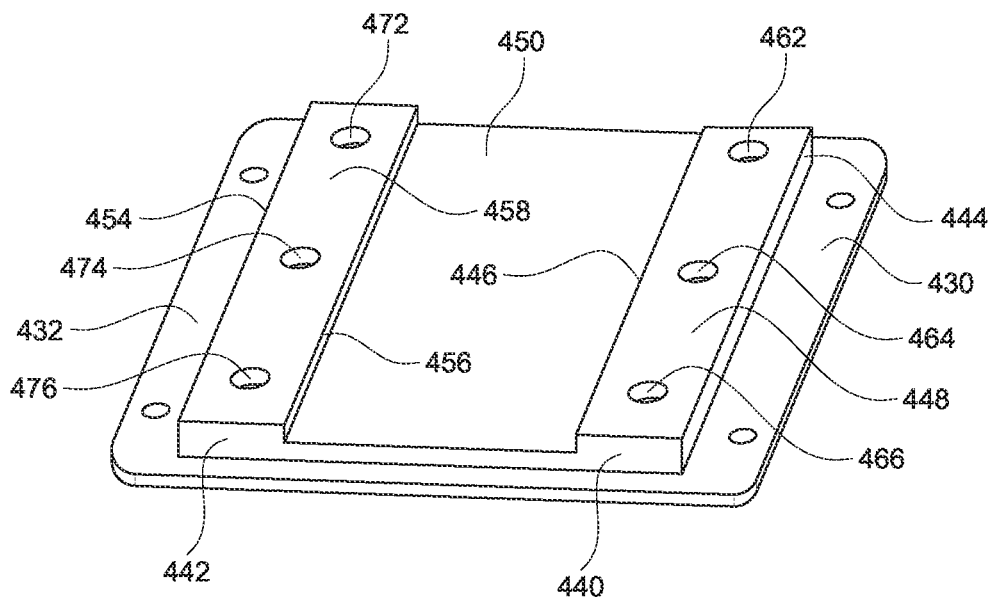
FIG. 4B is a perspective view of the lid member of the example cold plate in FIG. 4A, according to certain aspects of the present disclosure.
Figure 4C:
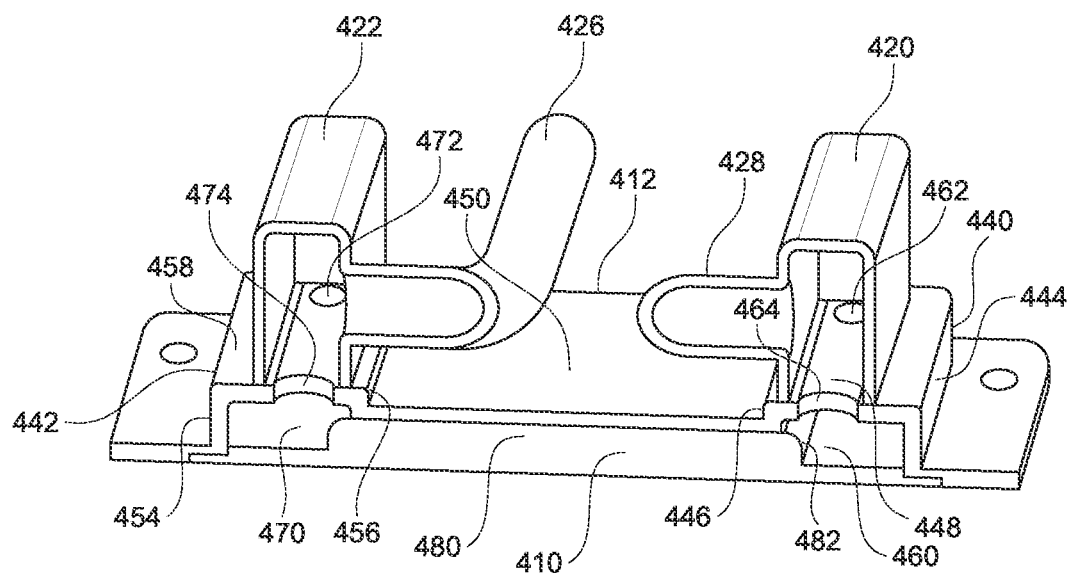
FIG. 4C is perspective cutaway view of the example cold plate in FIG. 4A, according to certain aspects of the present disclosure.

FIG. 4B is a perspective view of the lid member 412 of the example cold plate 400 in FIG. 4A. FIG. 4C is a cutaway perspective view of the inlet and outlet manifolds 420 and 422 in relation to the lower level manifolds formed by the base member 410 and the lid member 412 of the example cold plate 400 in FIG. 4A.

As shown in FIGS. 4A-4C, the lid member 412 includes two side tabs 430 and 432. Both of the side tabs 430 and 432 include several holes 434 that allow fasteners such as screws or bolts to be employed to attach the cold plate 400 to a chip socket on the motherboard of the computer component. The lid member 412 includes a lower level supply manifold housing 440 and a lower level collection manifold housing 442. The supply manifold housing 440 supplies coolant to the channels formed by fins in the interior of base member 410. The collection manifold housing 442 collects the heated coolant from the channels in the base member 410.

The rectangular supply manifold housing 440 includes an exterior side 444, an opposite interior side 446, and a top panel 448. A center plate 450 joins the rectangular lower level manifold housings 440 and 442. The rectangular collection manifold housing 442 includes an exterior side 454, an opposite interior side 456, and a top panel 458. The width of the center plate 450 is thus defined by the connected interior side 446 of the rectangular supply manifold housing 440 and the interior side 456 of the rectangular collection manifold housing 442.

As shown in FIG. 4C, the sides 444 and 446, and top panel 448 of the rectangular supply manifold housing 440 in combination with the base member 410 form an interior cavity 460 to allow distribution of fluid to the base member 410. The top panel 448 of the rectangular supply manifold housing 440 includes three coolant inlet apertures 462, 464, and 466 that allows fluid access to the interior cavity 460 of the rectangular supply manifold housing 440. The inlet manifold 420 in this example has a rectangular housing that covers the entire length of the supply manifold housing 440 to allow fluid communication to all of the coolant apertures 462, 464, and 466 to allow coolant to flow over the length of the cold plate 400. The sides 454 and 456, and top panel 458 of the rectangular collection manifold housing 442 in combination with the base member 410, form an interior cavity 470 to allow collection of fluid from the base member 410. The top panel 458 of the rectangular collection manifold housing 442 includes three spaced coolant apertures 472, 474, 476 that allows fluid access to the interior space 470 of the rectangular collection manifold housing 442. The outlet manifold 422 in this example has a rectangular housing with an area to cover all three coolant apertures 472, 474, 476 to allow collected coolant to flow into the coolant aperture 166.

The base member 410 includes a coolant flow section 480 that includes a series of parallel fins 482 that define channels that run along the length of the base member 410. The fins 482 are formed on an interior surface that forms part of the base member 410 in thermal contact with the heat-generating element. Each of the fins 482 include arc-shaped sections joining the top of the fin 482 with the bottom of the fin 482. In this example, the interior side 446 has an interior surface that defines a corner with the exterior surface of the top panel 448. Similar to the cold plate 100 described above, the corner in conjunction with the curved sections of the fins 482 trap debris before it enters the channel section 480.

In this example, the inlet apertures 462, 464, and 466 are spaced to match the length of a chip that is attached to the cold plate 400. Thus, the cold plate 400 provides efficient velocity distribution of the coolant for a chip that has roughly the same length of the cold plate 400. Fewer apertures may be provided for a chip that has a shorter length. For example, only two apertures may be provided for chips that have a length that is only about half that of the cold plate 400. Alternatively, a slit having an approximate length of the chip may be provided instead of the multiple apertures. Such a slit may distribute the coolant along the length of the chip.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments.

Rather, the scope of the disclosure should be defined in accordance with the following claims and their equivalents.

What is claimed is:

1. A cold plate for cooling a heat-generating component, the cold plate comprising:
    a lid member having a lower supply manifold housing and a lower collection manifold housing;
    a base member having an exterior surface for contacting the heat-generating component and an opposite interior surface, the base member including a plurality of coolant channels defined by a plurality of fins, each fin having a top section, a bottom section attached to the interior surface, and an arc-shaped section between the top and bottom sections, wherein an interior cavity is defined by the arc-shaped section of each of the fins, the interior surface of the base member, and the lower supply manifold housing, and wherein an interior corner is formed by the lower supply manifold housing at the top of the fins;
    an upper inlet manifold having a connector to receive coolant, the upper inlet manifold in fluid communication with the lower supply manifold housing; and
    an upper outlet manifold having a connector to circulate coolant, the upper outlet manifold in fluid communication with the lower collection manifold housing, wherein coolant flows from the lower supply manifold housing through the coolant channels to the lower collection manifold, wherein the plurality of fins is oriented with the arc-shaped sections arcing toward the lower supply manifold to face the coolant flowing from the lower supply manifold.

2. The cold plate of claim 1, wherein the lower supply manifold housing includes an inlet aperture.

3. The cold plate of claim 1, wherein the lower supply manifold housing includes a plurality of inlet apertures spaced over a length of the lower supply manifold housing.

4. The cold plate of claim 1, wherein the inlet manifold connector includes a tube connector.

5. The cold plate of claim 1, wherein the lid member and the base member are fabricated from one of a group of copper, copper alloy, stainless steel, and aluminum alloy.

6. The cold plate of claim 1, wherein the lid member and the base member are soldered together.

7. A cold plate for cooling a heat-generating component, the cold plate comprising:
    a lid member having a lower supply manifold housing and a lower collection manifold housing;
    a base member having an exterior surface for contacting the heat-generating component and an opposite interior surface, the base member including a plurality of coolant channels defined by a plurality of fins, each fin having a top section, a bottom section attached to the interior surface, and an arc-shaped section between the top and bottom sections, wherein an interior cavity is defined by the arc-shaped section of each of the fins, the interior surface of the base member, and the lower supply manifold housing, and wherein an interior corner is formed by the lower supply manifold housing at the top of the fins;
    an upper inlet manifold having a connector to receive coolant, the upper inlet manifold in fluid communication with the lower supply manifold housing, wherein the inlet manifold may be rotated relative to the lower supply manifold housing; and
    an upper outlet manifold having a connector to circulate coolant, the upper outlet manifold fluid communication with the lower collection manifold housing.

8. The cold plate of claim 1, wherein the lid member further includes a cover plate member disposed between the lower manifold housings, the lid member in contact with the top sections of the plurality of fins.

9. A computer system comprising:
    a heat-generating computer component; and
    a cold plate including:
        a lid member having a lower supply manifold housing and a lower collection manifold housing;
        a base member having an exterior surface contacting the heat-generating computer component and an opposite interior surface, the base member including a plurality of coolant channels defined by a plurality of fins, each having a top section, a bottom section attached to the interior surface, and an arc-shaped section between the top and bottom sections, wherein an interior cavity is defined by the arc-shaped section of each of the fins, the interior surface of the base, and the lower supply manifold housing, and wherein an interior corner is formed by the lower supply manifold housing of the lower manifold housing at the top of the fins;
        an upper inlet manifold having a connector to receive coolant, the upper inlet manifold in fluid communication with the lower supply manifold housing; and
        an upper outlet manifold having a connector to circulate coolant, the upper outlet manifold in fluid communication with the lower collection manifold housing, wherein coolant flows from the lower supply manifold housing through the coolant channels to the lower collection manifold, wherein the plurality of fins is oriented with the arc-shaped sections arcing toward the lower supply manifold to face the coolant flowing from the lower supply manifold.

10. The computer system of claim 9, wherein the lower supply manifold housing includes an inlet aperture.

11. The computer system of claim 9, wherein the lower supply manifold housing includes a plurality of inlet apertures spaced over a length of the lower supply manifold housing.

12. The computer system of claim 9, wherein the inlet manifold connector includes a tube connector coupled to a tube fluidly coupled to the cold coolant connector.

13. The computer system of claim 9, wherein the lid member and the base member are fabricated from copper.

14. The computer system of claim 9, wherein the lid member and the base member are soldered together.

15. The computer system of claim 9, wherein the inlet manifold may be rotated relative to the lower supply manifold housing.

16. The computer system of claim 9, wherein the lid member further includes a cover plate member disposed between the lower manifold housings, the lid member in contact with the top sections of the plurality of fins.

17. The computer system of claim 9, wherein heat-generating computer component is a processor chip.

18. A cold plate for cooling a heat-generating component, the cold plate comprising:
    a lid member having a lower supply manifold housing and a lower collection manifold housing, wherein the lower supply manifold housing includes a plurality of inlet apertures spaced over a length of the lower supply manifold housing;
    a base member having an exterior surface for contacting the heat-generating component and an opposite interior surface, the base member including a plurality of coolant channels defined by a plurality of fins, each fin having a top section, a bottom section attached to the interior surface, and an arc-shaped section between the top and bottom sections, wherein an interior cavity is defined by the arc-shaped section of each of the fins, the interior surface of the base member, and the lower supply manifold housing, and wherein an interior corner is formed by the lower supply manifold housing at the top of the fins;

an upper inlet manifold having a connector to receive coolant, the upper inlet manifold in fluid communication with the lower supply manifold housing; and an upper outlet manifold having a connector to circulate coolant, the upper outlet manifold in fluid communication with the lower collection manifold housing.

* * * * *